US006375508B1

(12) United States Patent
Pickles et al.

(10) Patent No.: US 6,375,508 B1
(45) Date of Patent: Apr. 23, 2002

(54) ELECTRICAL CONNECTOR ASSEMBLY HAVING THE SAME CIRCUIT BOARDS THEREIN

(75) Inventors: Chalres Sands Pickles, York, PA (US); Chih-Ming Chien, Tu-Chen (TW)

(73) Assignee: Hon Hai Precision Ind. Co.., Ltd., Taipei Hsien (TW)

( * ) Notice: Subject to any disclaimer, the term of this patent is extended or adjusted under 35 U.S.C. 154(b) by 0 days.

(21) Appl. No.: 09/749,086

(22) Filed: Dec. 26, 2000

(51) Int. Cl.[7] ...................... H01R 13/648; H01R 12/00; H05K 1/00

(52) U.S. Cl. .......................................... 439/608; 439/65

(58) Field of Search .............................. 439/58, 59, 62, 439/65, 76.1, 608, 79

(56) References Cited

U.S. PATENT DOCUMENTS 6,135,781 A * 10/2000 Pope et al. ................... 439/59
6,171,115 B1 * 1/2001 Mickievicz et al. ....... 439/76.1

* cited by examiner

*Primary Examiner*—Brian Sircus
*Assistant Examiner*—Chandrika Prasad
(74) *Attorney, Agent, or Firm*—Wei Te Chung

(57) ABSTRACT

An electrical connector assembly (1) includes a receptacle connector (4) and a plug connector (2). A plurality of circuit boards (10) each has a lower portion inserted into a corresponding groove (40) defined in a second housing (8) of the receptacle connector and electrically connecting with terminals (50, 60) therein. A front portion of each circuit board is inserted through a passageway (17) in a first housing (6) of the receptacle connector (4) and into a groove (46) defined in the plug connector and is electrically connected with terminals (82, 84) therein. The terminals of the receptacle connector and of the plug connector respectively connect to two different main circuit boards, providing electrical connection therebetween.

20 Claims, 9 Drawing Sheets

50

ELECTRICAL CONNECTOR ASSEMBLY HAVING THE SAME CIRCUIT BOARDS THEREIN

BACKGROUND OF THE INVENTION

1. Field of the Invention

The present invention relates to an electrical connector assembly, and particularly to an electrical connector assembly having a circuit board therein.

2. Description of the Prior Art

Printed circuit boards are sometimes included in electrical connector assemblies for high speed, high density communication applications since the circuit boards can modify the electrical characteristics, such as impedance and inductance, of the connector assembly to meet system requirements. Conventionally, such assemblies include a first circuit board and a second circuit board, each circuit board having contacts soldered along two edges thereof. One side of each first and second circuit board is connected to a main circuit board of a corresponding first and second electrical device. A second side of the first circuit board is then connected to a second side of the second circuit board, whereby the two electrical devices are electrically connected together.

A prior art electrical connector assembly of this type is disclosed in U.S. Pat. No. 5,924,899.

The price of a high density, high speed connector assembly of this type is high because the cost of the contacts and the cost of soldering the contacts to the circuit boards is high.

Hence, an improved electrical connector assembly is required to overcome the disadvantages of the prior art.

BRIEF SUMMARY OF THE INVENTION

A main object of the present invention is to provide a high speed, high density electrical connector assembly which is easy to manufacture and has a low cost.

In order to achieve the above object, an electrical connector assembly includes a receptacle connector and a plug connector. The receptacle connector comprises a dielectric first housing, a dielectric second housing, and a plurality of parallel circuit boards, grounding members, and signal terminals received therein. The first housing comprises two sidewalls and a plurality of inner walls parallel to the two sidewalls defining a plurality of passageways therebetween. The second housing comprises two sidewalls and a plurality of partitions formed parallel to the two sidewalls, thereby defining a plurality of grooves therebetween. Each circuit board is received in a corresponding passageway and a corresponding groove, and has a plurality of first golden fingers aligned in a row parallel to a mating direction with the plug connector and a plurality of second golden fingers aligned in a row perpendicular to said mating direction, wherein each first golden finger connects with a terminal fixed in the second housing. Upper and lower flanges extend forwardly from a top and a bottom of a mating face of the first housing. Both the upper and lower flanges each define a plurality of recesses therein.

The plug connector has a dielectric housing and a plurality of grooves defined in the dielectric housing. Each groove receives a front end of one of the circuit boards. A plurality of terminals and grounding members are fixed in the dielectric housing of the plug connector, extending into the grooves thereof and engaging with the second golden fingers. The plug connector has two lateral walls at two ends thereof, and two slots, each slot adjacent toa corresponding lateral wall. Each slot receives a corresponding one of the upper and lower flanges. Each lateral wall further forms a plurality of protrusions which fit into the recesses defined in the flanges of the first housing of the receptacle connector.

Other objects, advantages and novel features of the invention will become more apparent from the following detailed description of the present embodiment when taken in conjunction with the accompanying drawings.

DETAILED DESCRIPTION OF THE INVENTION

Figure 1:
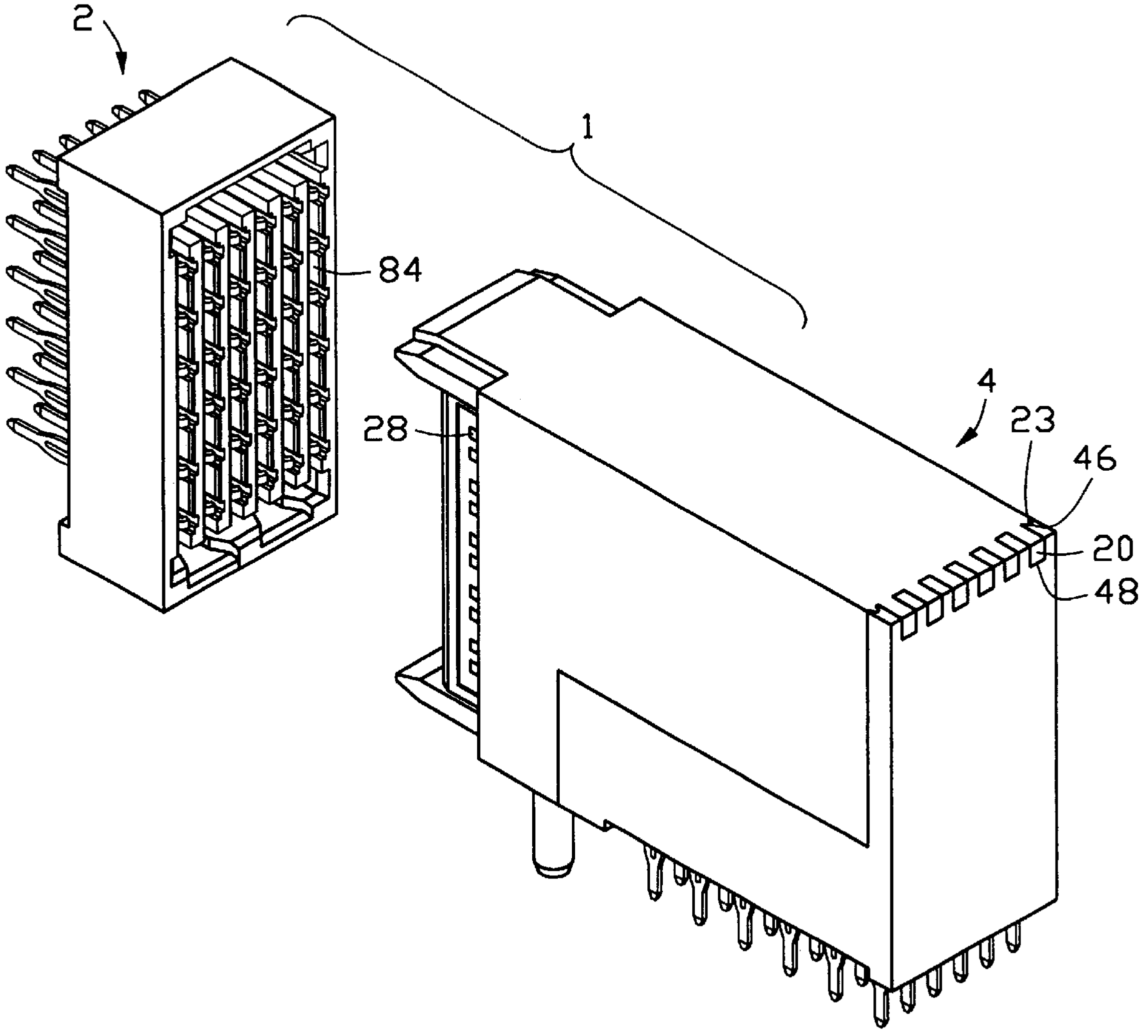
FIG. 1 is a perspective view showing an electrical connector assembly in accordance with the present invention which includes a plug connector and a receptacle connector.

Referring to FIG. 1, an electrical connector assembly 1 in accordance with the present invention comprises a plug connector 2 and a corresponding receptacle connector 4.

Figure 2:
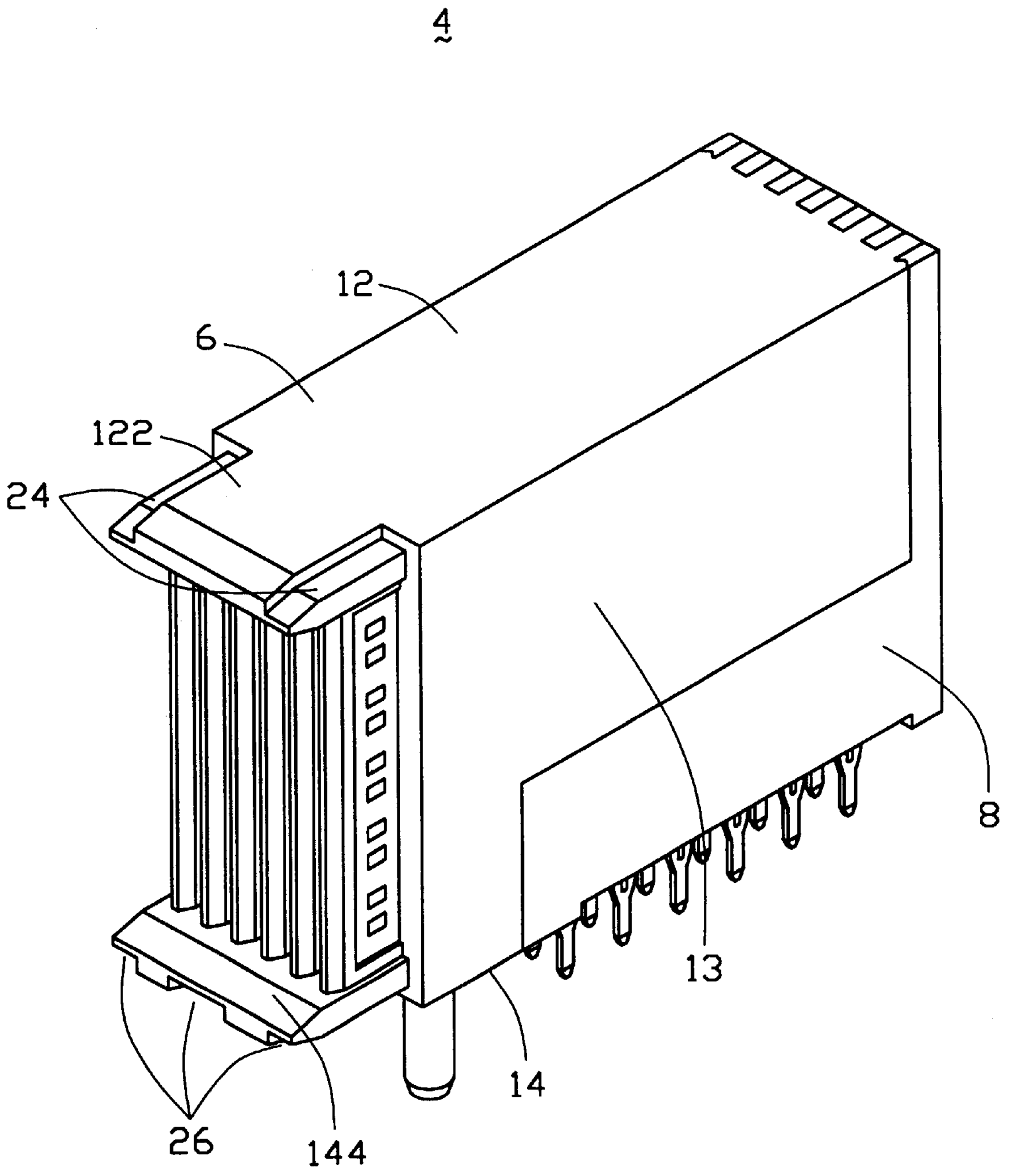
FIG. 2 is a perspective view of the receptacle connector from a front aspect.
Figure 3:
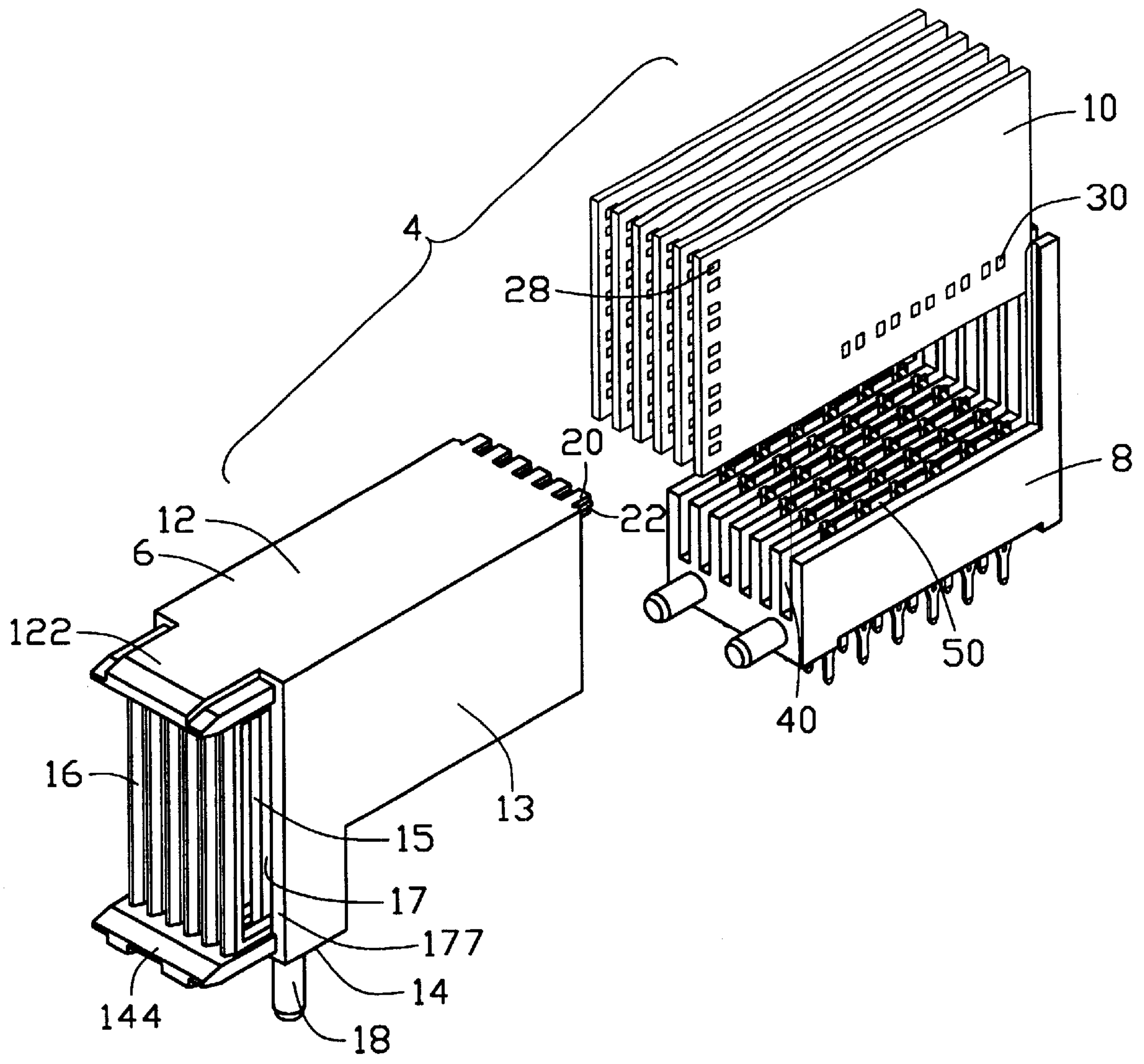
FIG. 3 is an exploded perspective view of the receptacle connector.
Figure 7:
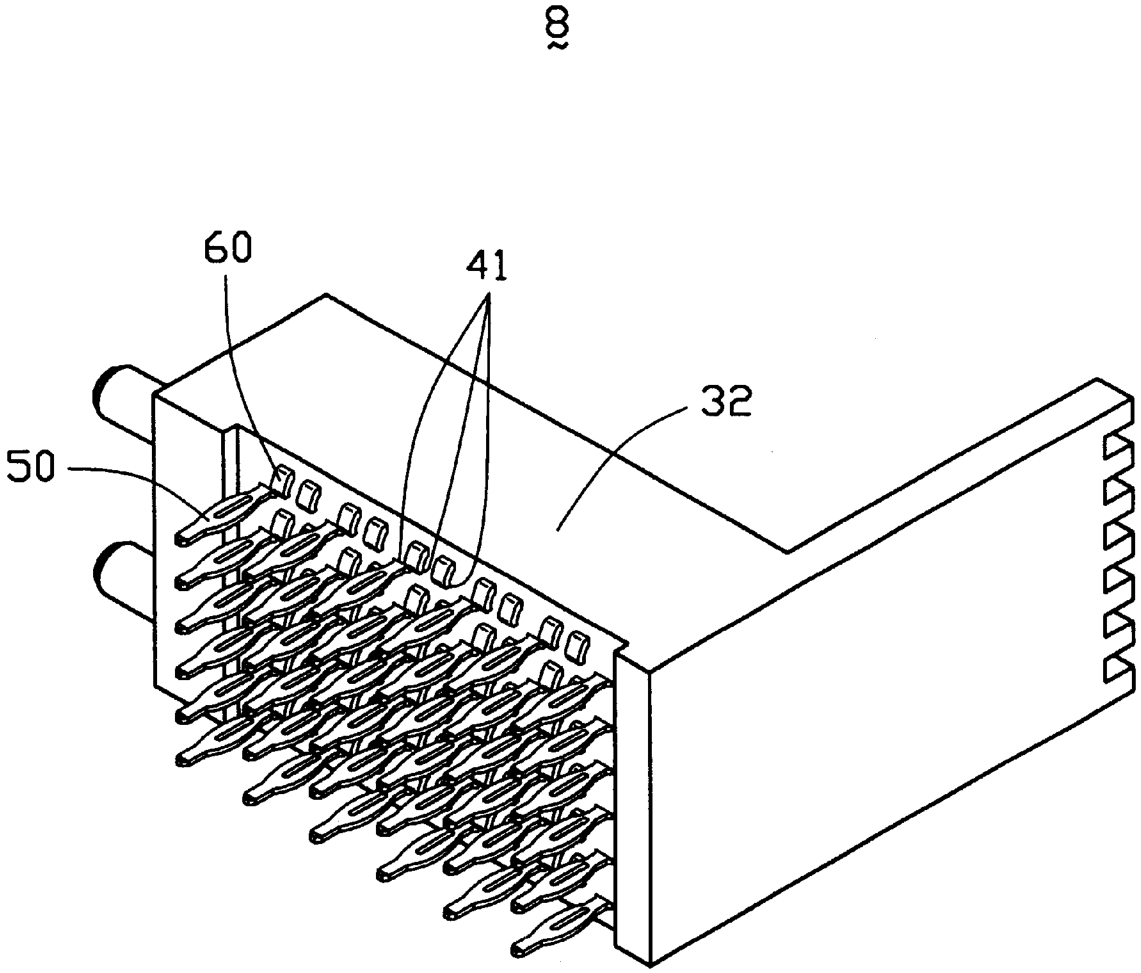
FIG. 7 is a perspective view of the second housing from a bottom aspect.

Also referring to FIGS. 2, 3 and 7, the receptacle connector 4 includes an insulative first housing 6, an insulative second housing 8, six circuit boards 10, and a plurality of grounding members 50 and signal terminals 60. The first housing 6 integrally forms a top wall 12, two sidewalls 13, and a bottom wall 14. An upper flange 122 and a lower flange 144 extend forwardly from the top wall 12 and the bottom wall 14, respectively, beyond a mating face 177 of the receptacle connector 4. A plurality of guiding ribs 16 is formed in front of the mating face 177 between the upper flange 122 and the lower flange 144. The upper flange 122 defines two recesses 24in two lateral sides of an upper surface thereof, and the lower flange 144 defines three recesses 26 in a lower surface thereof. Five inner walls 15 are formed parallel to the two sidewalls 13 between the top wall 12 and the bottom wall 14, thereby defining six passageways 17 in the first housing 6. Each guiding rib 16 is in alignment with a corresponding passageway 17. A pair of posts 18 extends downwardly from the bottom wall 14. Moreover, the first housing 6 integrally forms six projections 20 extending rearwardly from a rear end of the top wall 12. Each projection 20 comprises a pair ofbearing ribs 22 at opposite lateral edges thereof. Two arced edges 23 are formed at a rear end of the two sidewalls 13, as shown in FIG. 1.

Each circuit board 10 has a flat, rectangular shape with a planar right face (not labeled), shown in FIG. 3, and a planar left face opposite the right face, not visible in FIG. 3. Each right face has two rows of golden fingers 28, 30 respectively located near front and lower edges of the circuit board. Each left face also has two rows of golden fingers (not shown) respectively located near front and lower edges of the circuit board. Each row of golden fingers 28, 30 consists of five pairs of golden fingers. Each row of golden fingers on the left face includes six equidistantly spaced golden fingers. The golden fingers 28, 30 are used for signal transmission. The golden fingers on the left face of the circuit board 10 are used for grounding. The golden fingers 28 are aligned in a row perpendicular to the mating direction of the plug connector 2 with the receptacle connector 4, and the golden fingers 30 are aligned in a row parallel to said mating direction. In addition, each pair of golden fingers 28 is electrically connected with a corresponding pair of the golden fingers 30 via circuitry in the circuit board 10. The golden fingers on the front edge left face of each circuit board 10 are connected with corresponding golden fingers on the lower edge of the left face of the same circuit board 10 via the circuitry in the circuit board 10. Furthermore, for each circuit board 10, each individual circuit trace of a pair of circuit traces, which connect a pair of golden fingers 28 with a corresponding pair of golden fingers 30, have equal length. This allows differential pair signal processing between the two, wherein the same signal is carried by each trace of a pair of traces, allowing noise to be easily subtracted from said pair.

Figure 4:
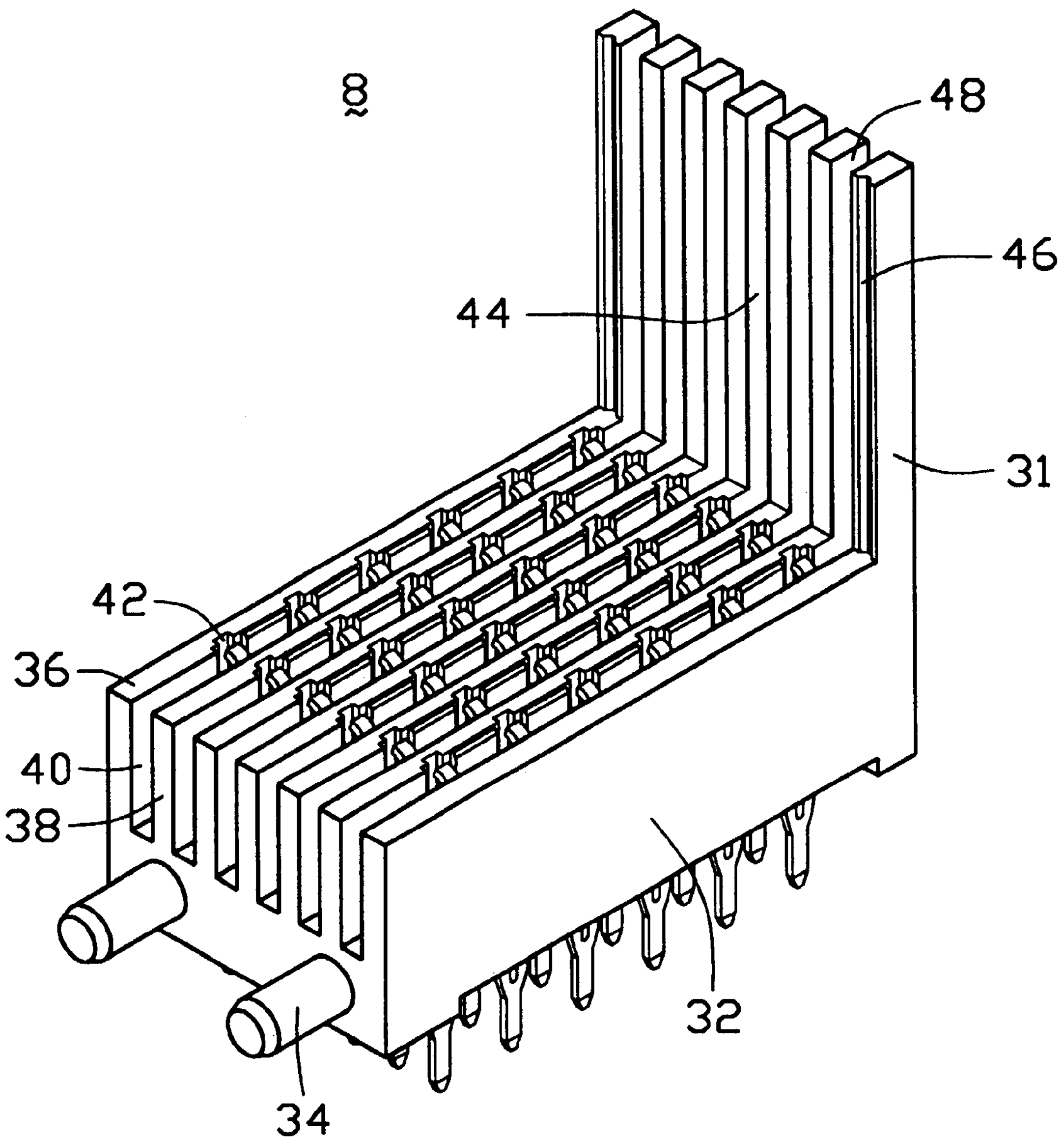
FIG. 4 is a perspective view of a second housing of the receptacle connector.

Also referring to FIG. 4, the second housing 8 has a base portion 32 and a back wall 31 perpendicularly upwardly extending from a rear end of the base portion 32. The base portion 32 includes a pair of mounting studs 34 extending forwardly from a lower portion of a front face (not labeled) of the base portion 32, and further comprises two sidewalls 36 and five partitions 38 between the sidewalls 36, whereby six grooves 40 are formed in the second housing 8. Each groove 40 communicates with a bottom face (not labeled, shown in FIG. 7) via a plurality of apertures 41 linearly arranged and defined through the bottom face. Six recesses 42 are defined in a right side of each of the partitions 38 and in a right side of the left sidewall 36. Furthermore, the back wall 31 defines six slots 44 therein communicating with the six grooves 40, and a pair of channels 46 located at opposite sides of the back wall 31. Six depressions 48 are defined in a top, free end of the back wall 31 communicating with the six slots 44.

Figure 5:
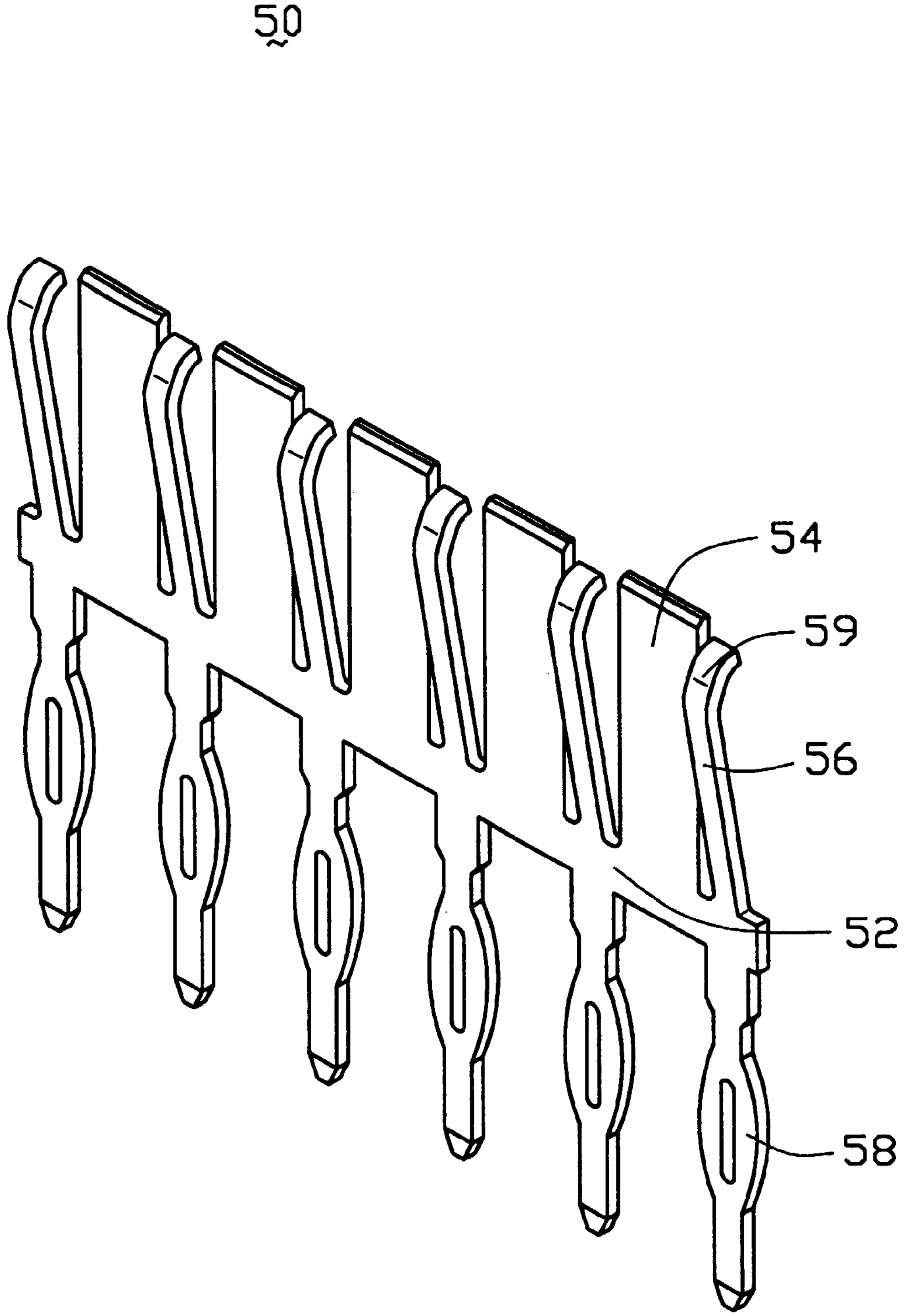
FIG. 5 is a perspective view of a grounding member of the receptacle connector.

Referring to FIG. 5, each grounding member 50 has a central stem 52, six press-fit sections 58 extending downwardly from the central stem 52, and five stiffening tabs 54 and six resilient arms 56 extending upwardly from the central stem 52, wherein the stiffening tabs 54 and the resilient arms 56 are arranged alternately with each other. Each resilient arm 56 further defines an engaging section 59 near a free end thereof. The receptacle connector 4 includes six grounding members 50 respectively received in the six grooves 40, with the press-fit portions 58 extending through corresponding apertures 41 and beyond a bottom face of the base portion 32 (FIG. 7) for being press fitted into a first main circuit board (not shown) of a first electrical device (not shown). The six resilient arms 56 of each grounding member 50 are respectively received in six corresponding recesses 42, and the five stiffening tabs 54 abut against the right side of a corresponding partition 38 or theright side of the left sidewall 36 for the terminal member 50 received in the leftmost groove.

Figure 6:
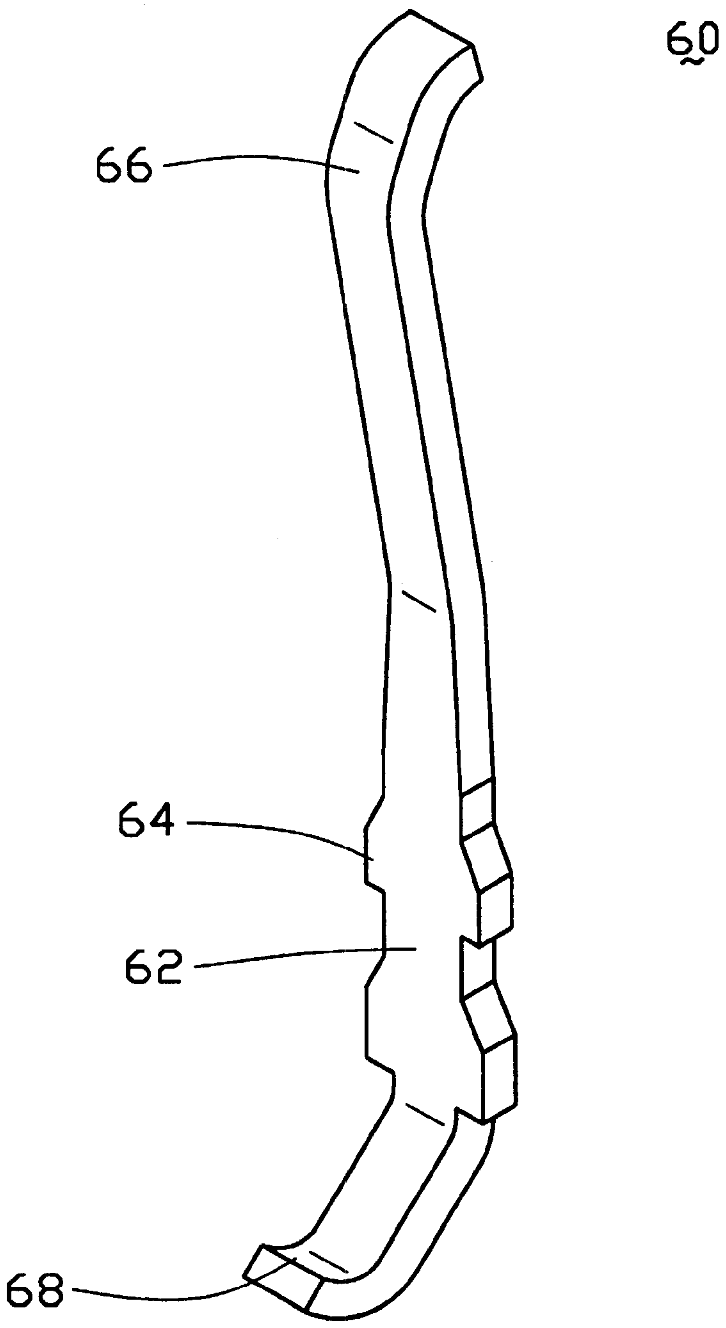
FIG. 6 is a perspective view of a signal terminal of the receptacle connector.

FIG. 6 shows a signal terminal 60 which has an elongated configuration with an upper arced contacting portion 66 for electrically engaging with a golden finger 30, a pair of protrusions 64 on each of two lateral sides of a middle portion 62 for having an interferential engagement with the base portion 32, and a lower arced foot 68 for electrically contacting with a contact point on the first main circuit board (not shown).

Particularly referring to FIG. 7, ten signal terminals 60 arranged in five pairs are fixed in each groove 40 of the base portion 32. The ten signal terminals 60 are received in a side of a corresponding groove 40 opposite the side of the groove 40 where the corresponding grounding member 50 is located. The protrusions 64 fixedly engage with the base portion 32, the arced feet 68 are exposed from the bottom face (not labeled) of the base portion 32, and the arced contact portions 66 protrude into the corresponding groove 40. Each pair of the signal terminals 60 is located opposite a corresponding stiffening tab 54 of the grounding member 50 fixed in the same groove 40.

Figure 8:
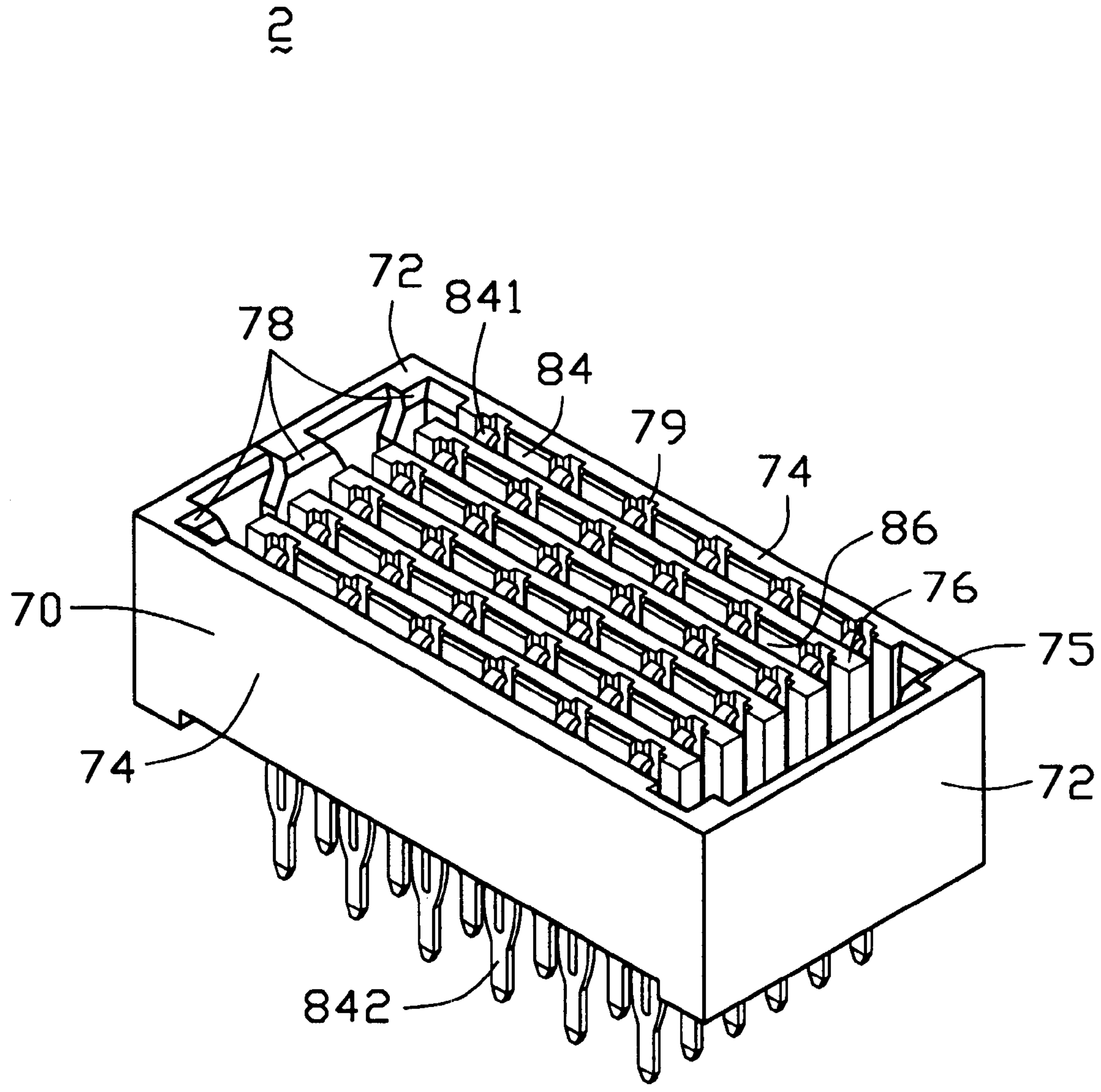
FIG. 8 is a perspective view of the plug connector of FIG. 1 from a rear aspect.
Figure 9:
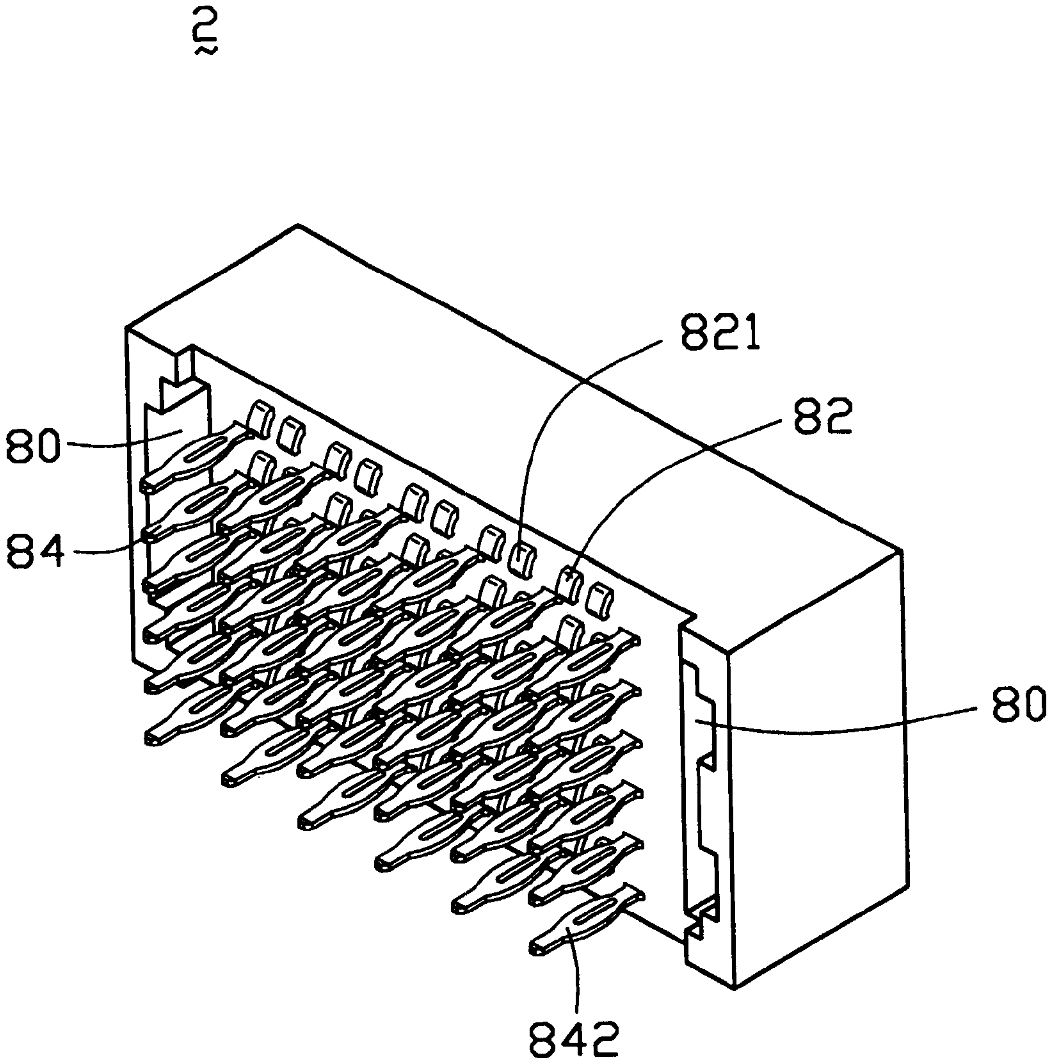
FIG. 9 is a view similar to FIG. 7, showing a front aspect of the plug connector.

Referring to FIGS. 8 and 9, the plug connector 2 includes an insulative housing 70 and a plurality of grounding members 84 and signal terminals 82 received therein. The insulative housing 70 of the plug connector 2 has a cuboidal shape with two lateral walls 72, two sidewalls 74 and five baffles 76 extending parallel to and between the two sidewalls 74, thereby defining six grooves 86 in the housing 70. An upper lateral wall 72 forms two protrusions 75 at two opposite sides of an inner face thereof, and a lower lateral wall 72 forms three protrusions 78 in an inner face thereof. Adjacent to each lateral wall 72, a slot 80 is defined extending through the housing 70 of the plug connector 2.

The structure of the plug connector 2 resembles the structure of the second housing 8 of the receptacle connector 4 in that six recesses 79 are defined in a left side of each of the baffles 76 and in a left side of a right sidewall 74. Six grounding members 84, each of which has a configuration similar to that of the grounding members 50, are received in corresponding grooves 86 so that resilient arms 841 of the grounding members 84 are received in corresponding recesses 79, and press-fit portions 842 of the grounding members 84 extend beyond a front face (not labeled) of the housing 70 for being press fitted into a second main circuit board (not shown) of a second electrical device (not shown). In addition, the plug connector 2 has the plurality of signal terminals 82, each of which has a configuration and arrangement similar to the signal terminals 60 in the second housing 8 of the receptacle connector 4. The signal terminals 82 each have an arced foot 821 extending beyond the front face (not labeled) of the housing 70 for engaging with a contact pad on the second main circuit board.

In assembly, referring back to FIGS. 1–4 and 7, the grounding members 50 and the signal terminals 60 are assembled to the second housing 8 of the receptacle connector 4 in a manner as mentioned before. Then the circuit boards 10 are inserted into corresponding grooves 40 of the second housing 8 to a position wherein the golden fingers 30 engage with the arced contacting portions 66 of the signal terminals 60 and the golden fingers on the lower edge of the left face of the circuit boards 10 engage with engaging sections 59 of the grounding members 50. A rear edge of each circuit board 10 is received in a corresponding slot 44. Subsequently, the first housing 6 is assembled to the second housing 8, so that the projections 20 together with the bearing ribs 22 are securely fitted into the depressions 48, respectively. The arced edges 23 engage with the pair of channels 46 and the circuit boards 10 are partially received in the passageways 17 with front edges of the circuit boards 10 abutting against a rear side of the guiding ribs 16. Furthermore, the mounting studs 34 are inserted into corresponding holes (not shown) defined in the first housing 6 to combine the first housing 6 and the second housing 8 together.

To assemble the plug connector 2, the grounding members 84 are inserted into the six grooves 86 of the housing 70. The press-fit portions 842 protrude beyond the front face of the housing 70 and each resilient arm 841 is received in a corresponding recess 79. Ten signal terminals 82 are inserted into each groove 86 of the housing 70, arced contacting portions (not shown) of the signal terminals 82 being received in corresponding grooves at a side of the groove opposite a corresponding grounding member 84. The arced foot 821 of each signal terminal 82 extends beyond the front face (not labeled) of the housing 70.

When mating, referring to FIGS. 1, 2 and 7, the upper and lower flanges 122, 144 of the receptacle connector 4 extend into the slots 80 of the plug connector 2 to reach a position wherein the protrusions 75, 78 formed in the housing 70 of the plug connector 2 fit into the corresponding recesses 24, 26 of the receptacle connector 4. The guiding ribs 16 and the front end portions of the circuit boards 10 are inserted into corresponding grooves 86 of the plug connector 2, whereby the golden fingers 28 of each circuit board 10 engage with corresponding arced contacting portions of the signal terminals 82 and the golden fingers on the front edge of the left face of each circuit board 10 engage with the resilient arms 841 of a corresponding grounding member 84. Thus, the receptacle and plug connectors 4, 2 are electrically connected together.

The present invention requires no soldering of contacts to the circuit boards 10 of the connector assembly 1. Thus, the connector assembly is made more easily and at a lower cost.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:

a receptacle connector comprising:

an insulative receptacle housing;

a plurality of identical circuit boards received in the receptacle housing, each circuit board defining a plurality of first golden fingers and a plurality of second golden fingers; and a plurality of first terminals having signal and grounding members fixed in the receptacle housing, each first terminal having a contacting portion engaging with a corresponding first golden finger; wherein each grounding member comprises a central stem, a plurality of stiffening tabs and resilient arms extending upward from the central stem, and a plurality of press-fit sections extending downward from the central stem and a plug connector mated with the receptacle connector, said plug connector comprising:

an insulative plug housing defining a plurality of grooves therein, each groove receiving an end portion of a corresponding circuit board; and a plurality of second terminals fixed in the insulative plug housing and engaging with the second golden fingers.

2. The electrical connector assembly as claimed in claim 1, wherein the first golden fingers are provided on opposite left and right faces of each of the circuit boards and the first terminals comprise signal terminals and grounding members, and the signal terminals engage with the first golden fingers on the right face of each circuit board, and the grounding members engage with the first golden fingers on the left face of each circuit board.

3. The electrical connector assembly as claimed in claim 2, wherein the first golden fingers are arranged in rows extending in a direction parallel to a mating direction of the receptacle and plug connectors and the second golden fingers are arranged in rows extending in a direction perpendicular to the mating direction.

4. The electrical connector assembly as claimed in claim 1, wherein the insulative receptacle housing includes a first housing and a second housing.

5. The electrical connector assembly as claimed in claim 4, wherein the first housing comprises two sidewalls and a plurality of inner walls between the two sidewalls, thereby defining a plurality of passageways in the first housing, and the passageways partially receive the circuit boards therein.

6. The electrical connector assembly as claimed in claim 5, wherein the second housing comprises two sidewalls and a plurality of partitions between the two sidewalls, thereby defining a plurality of grooves in the second housing, and the grooves partially receive the circuit boards therein.

7. The electrical connector assembly as claimed in claim 6, wherein the first housing has a top wall and a bottom wall and upper and lower flanges extending forwardly from the top and bottom walls, respectively.

8. The electrical connector assembly as claimed in claim 7, wherein the plug housing has two lateral walls at an upper and lower end thereof, and two slots adjacent to the lateral walls, and the two slots fittingly receive respective upper and lower flanges of the first housing.

9. The electrical connector assembly as claimed in claim 8, wherein at least a recess is defined in each of the upper and lower flanges of the first housing and the plug housing forms a corresponding at least a protrusion projecting into each of the slots, and the protrusions fit in corresponding recesses.

10. The electrical connector assembly as claimed in claim 7, wherein the first housing further has a plurality of guiding ribs positioned between the upper and lower flanges, and the circuit boards each have a front end abutting against a rear side of a corresponding guiding rib.

11. The electrical connector assembly as claimed in claim 7, wherein the first housing integrally forms a plurality of projections at a rear end of the top wall thereof and each projection includes a pair of bearing ribs at opposite edges thereof.

12. The electrical connector assembly as claimed in claim 11, wherein the second housing further has a back wall defining a plurality of slots therein and each of the slots corresponds to a groove of the second housing.

13. The electrical connector assembly as claimed in claim 12, wherein the back wall defines a plurality of depressions in a free end thereof and said depressions securely receive the projections of the first housing therein.

14. The electrical connector assembly as claimed in claim 4, wherein the second housing forms a pair of mounting studs inserted into the first housing to more securely connect the first housing and the second housing together.

15. The electrical connector assembly as claimed in claim 1, wherein the stiffening tabs and the resilient arms are arranged in an alternating order with each other.

16. The electrical connector assembly as claimed in claim 15, wherein the second housing defines a plurality of recesses receiving respective resilient arms.

17. An electrical connector assembly, including:

a receptacle connector comprising an insulative housing, a circuit board received in the insulative housing, said circuit board having first and second groups of electrical contacts thereon, a plurality of receptacle terminals fixed in the housing and electrically contacting with the first group of electrical contacts;

a plug connector having an insulative housing defining at least a groove therein, and a plurality of plug terminals received in the groove, a portion of the circuit board being inserted into the groove to a position wherein the plug terminals of the plug connector electrically engage with the second group of electrical contacts;

wherein the first and second groups of electrical contacts each have contacts formed on opposite main faces of the circuit board, and wherein the receptacle terminals of the receptacle connector comprise signal terminals and grounding terminals electrically contacting with the electrical contacts of the first group on respective opposite faces of the circuit board.

18. The electrical connector assembly as claimed in claim 17, wherein the grounding terminals have press-fit tails adapted for being press fitted to a main printed circuit board of an attached electrical device, and the signal terminals have arc-shaped tails adapted for electrically contacting with the main printed circuit board.

19. The electrical connector assembly as claimed in claim 18, wherein the grounding terminals are electrically and mechanically connected with each other.

20. The electrical connector assembly as claimed in claim 17, wherein the housing of the receptacle connector forms a guiding rib abutting an end of the circuit board which is inserted into the groove of the housing of the plug connector.

* * * * *